(12) United States Patent
Shimmoto

(10) Patent No.: US 7,709,348 B2
(45) Date of Patent: May 4, 2010

(54) METHOD FOR MANUFACTURING SEMICONDUCTOR DEVICE

(75) Inventor: Kaoru Shimmoto, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/320,243

(22) Filed: Jan. 22, 2009

(65) Prior Publication Data

US 2009/0197389 A1 Aug. 6, 2009

(30) Foreign Application Priority Data

Feb. 4, 2008 (JP) ............................... 2008-023707

(51) Int. Cl.
*H01L 21/76* (2006.01)
(52) U.S. Cl. ................. 438/439; 438/479; 257/E29.02; 257/E21.552; 257/E21.564
(58) Field of Classification Search ................. 438/439, 438/479; 257/E29.02, E21.552, E21.564
See application file for complete search history.

(56) References Cited

U.S. PATENT DOCUMENTS 7,312,124 B2 12/2007 Doumae et al.

2006/0270125 A1* 11/2006 Domae ........................ 438/151

FOREIGN PATENT DOCUMENTS

JP 2005-353745 12/2005

* cited by examiner

*Primary Examiner*—Matthew Smith
*Assistant Examiner*—Julio J Maldonado
(74) *Attorney, Agent, or Firm*—Rabin & Berdo, PC

(57) ABSTRACT

The present invention provides a method for manufacturing a semiconductor device, comprising the steps of preparing a substrate having a quartz support substrate and a silicon layer, forming a base or substrate silicon oxide film over the entire upper surface of the silicon layer, forming a silicon nitride film over the entire upper surface of the substrate silicon oxide film by a plasma CVD method, patterning the silicon nitride film thereby to form a mask pattern having a circumferential exposure portion that exposes the substrate silicon oxide film in a circumferential area, a first opening pattern that exposes the substrate silicon oxide film in an element isolation area, and a second opening pattern that exposes the substrate silicon oxide film within a peripheral area, and thermally oxidizing the substrate using the mask pattern as a mask thereby to form an element isolation structure portion in the element isolation area.

4 Claims, 5 Drawing Sheets

METHOD FOR MANUFACTURING SEMICONDUCTOR DEVICE

BACKGROUND OF THE INVENTION

The present invention relates to a method for manufacturing semiconductor devices each element-separated by a so-called field oxide film.

There has been known an example wherein a so-called SOQ (Silicon On Quartz) substrate in which a support substrate is of an insulative quartz support substrate, is used to obtain a semiconductor device having excellent characteristics such as high frequency characteristics and radiation-proof characteristics.

In a thermal oxidation step for forming a field oxide film using a LOCOS (Local Oxidation of Silicon) method, a mask pattern obtained by patterning a silicon nitride film is used in such an SOQ substrate.

The formation of the silicon nitride film is generally performed by an LP-CVD (Low Pressure Chemical Vapor Deposition) method performed at low pressure.

There has been known, for example, a configuration wherein in a semiconductor device manufacturing method in which element or device isolation is done by means of a field oxide film, a mask pattern applied to a LOCOS method, i.e., a thermal oxidation step is formed of a silicon nitride film formed by a CVD method with a view of preventing undesired thinning of an element isolation area or region due to an etching step (refer to a patent document 1 (Japanese Patent Publication Laid Open Number 2005-353745)).

It has been known that the mask pattern obtained by patterning the silicon nitride film formed by the LP-CVD method in particular, which is used in such a thermal oxidation step, produces extremely large tensile stress of 1 GPa (Giga pascal) to 2 GPa over a full range from room temperature (low temperature.) to about 800° C. (high temperature) at which the thermal oxidation step is done.

Problems involved in the related art will now be explained with reference to FIG. 5.

FIG. 5 is a photographic diagram for explaining the related art. The drawing shows a stacked or laminated structure in which a base or substrate silicon oxide film 134 and a silicon nitride film 140' are laminated on an SOQ substrate 120 in this order.

Described concretely, an SOQ substrate is prepared in which a silicon layer 130 having a thickness of 100 nm is laminated on a quartz support plate 120 having a thickness of 625 μm.

Next, a laminated structure is obtained in which a substrate silicon oxide film 134 having a thickness of 160 nm is formed, and a silicon nitride film 140' having a thickness of 300 nm is formed on the substrate silicon oxide film 134 by an LP-CVD method.

The so-obtained laminated structure is observed by an SEM (Scanning Electron Microscope).

As shown in FIG. 5, a crack 150 has occurred which extends through (cut longitudinally) the silicon nitride film 140', the substrate silicon oxide film 134 and the silicon layer 130 and reaches within the thickness of the quartz support substrate 120.

Thus, when the SOQ substrate is used and the silicon nitride film, i.e., the mask pattern for the thermal oxidation step is formed on the SOQ substrate, the quartz support substrate and the thin structure provided on the quartz support substrate may cause cracks due to the tensile stress and the difference between the silicon nitride film and the quartz support substrate in the extent of thermal expansion. As a result, there is at risk of impairing electrical characteristics of a manufactured semiconductor device.

The inventors of the present invention have found out that in forging ahead with extensive investigations, a mask pattern used in a thermal oxidation step in a LOCOS method is formed by a plasma CVD (PE-CVD: Plasma Enhanced Chemical Vapor Deposition) method and the form of the mask pattern is devised thereby to enable the solution of the conventional problems, thus leading to completion of this invention.

SUMMARY OF THE INVENTION

The present invention has been made in view of the conventional problems. It is therefore an object of the present invention to more effectively prevent the occurrence of cracks in a support substrate and a film structure provided on the support substrate due to tensile stress of a mask pattern employed in a thermal oxidation step.

According to one aspect of the present invention, for attaining the above object, there is provided a method for manufacturing a semiconductor device. The method may preferably include the following steps:

A substrate having a quartz support substrate having a first main surface and a second main surface opposite to the first main surface, and a silicon layer provided over the first main surface is first prepared.

A chip forming area including element forming areas and an element isolation area lying outside the element forming areas, and a chip non-forming area lying outside the chip forming area and including a ring-shaped circumferential area set inwardly out of a circumferential end face of the substrate and a peripheral area which surrounds the chip forming area inwardly from the circumferential area are set to the substrate.

A base or substrate silicon oxide film is formed over the entire upper surface of the silicon layer.

A silicon nitride film is formed over the entire upper surface of the substrate silicon oxide film by a plasma CVD method.

The silicon nitride film is pattered to form a mask pattern having a circumferential exposure portion that exposes the substrate silicon oxide film in the circumferential area, a first opening pattern that exposes the substrate silicon oxide film of the element isolation area in the chip forming area, and a second opening pattern that exposes the substrate silicon oxide film within the peripheral area.

The substrate is thermally oxidized using the mask pattern as a mask thereby to form an element isolation structure portion in the silicon layer of the element isolation area.

The mask pattern and the substrate silicon oxide film are eliminated.

According to the semiconductor device manufacturing method of the present invention, a mask pattern employed in a thermal oxidation step in a LOCOS method is formed by patterning a silicon nitride film formed by a plasma CVD method instead of the conventional LP-CVD method. Therefore, the corresponding mask pattern can be configured by a silicon nitride film extremely low in tensile stress in a range from a low temperature, for example, room temperature to about 400° C. Thus, since the tensile stress in the range from the room temperature to about 400° C. in particular becomes extremely small, the occurrence of cracks in this temperature range can be prevented effectively.

As to the form of the mask pattern, a dummy pattern is formed even in a chip forming area that surrounds a chip forming area to more reduce the surface area of the mask pattern.

Thus, the tensile stress is more relaxed and the occurrence of cracks at a high temperature, i.e., 400° C. or higher, particularly about 800° C. at which the thermal oxidation step is performed, can be prevented more effectively.

A silicon nitride film of a ring-shaped partial region or area, i.e., a circumferential area located inwardly out of a circumferential end face of a substrate, i.e., a wafer is eliminated to provide a circumferential exposure portion, whereby the occurrence of cracks from the wafer's circumferential area easy to have flaws and to be subjected to the sticking of particles and liable to become the origin of occurrence of each crack, can be prevented more effectively.

Thus, according to the semiconductor device manufacturing method of the present invention, no further steps are required and the occurrence of cracks can be prevented effectively.

It is therefore possible to more improve the yield of each manufactured semiconductor device and more reduce its manufacturing cost as a consequence.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the shape, size and physical relationship of each constituent element in the accompanying drawings are merely approximate illustrations to enable an understanding of the present invention. The present invention is not limited thereby in particular.

(Manufacturing Method of Semiconductor Device)

A method for manufacturing each semiconductor device according to a preferred embodiment of the present invention will be explained with reference to FIGS. 1, 2 and 3.

Figure 1A:
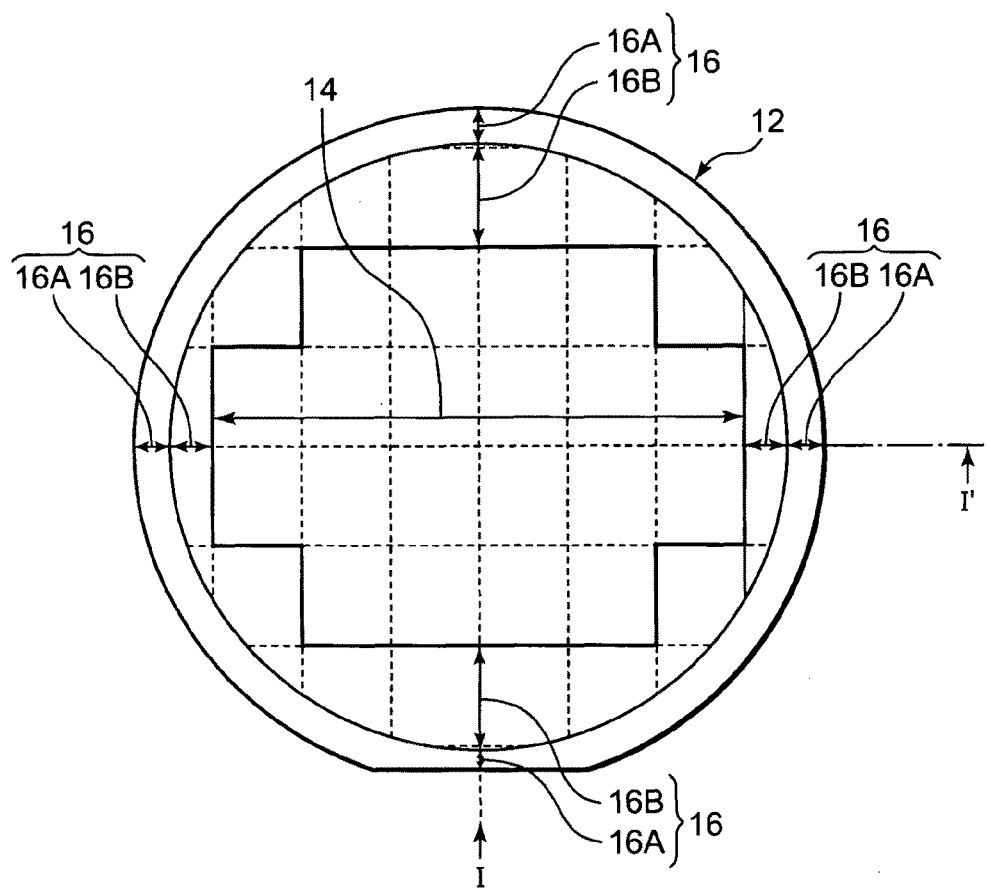
FIG. 1A is a schematic plan view of a substrate including each semiconductor device being in the process of its manufacture as viewed on its upper surface side.
Figure 1B:
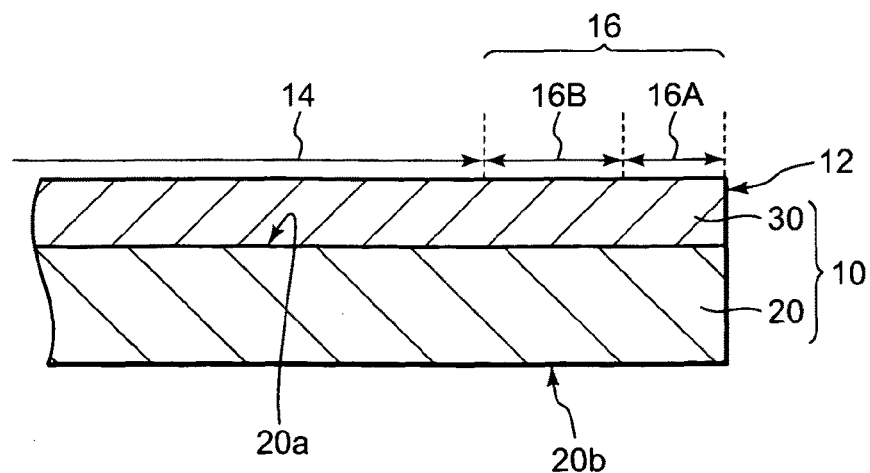
FIG. 1B is a view schematically showing a partial area of the substrate as its surface cut along dashed-dotted line I-I' of FIG. 1B is seen in the direction indicated by arrows.

FIG. 1A is a schematic plan view of a substrate, i.e., a wafer including semiconductor devices being in the process of their manufacture as viewed on its upper surface side. FIG. 1B is a view schematically showing a partial area of the substrate as its surface cut along dashed-dotted line I-I' of FIG. 1A is seen in the direction indicated by arrows.

Figure 2A:
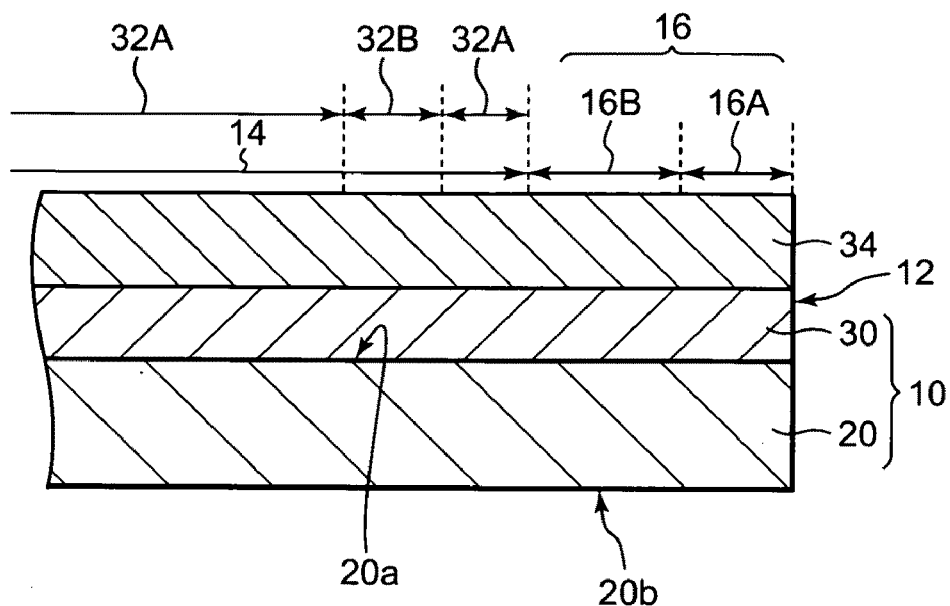
FIGS. 2A and 2B are respectively schematic views following FIG. 1B.
Figure 2B:
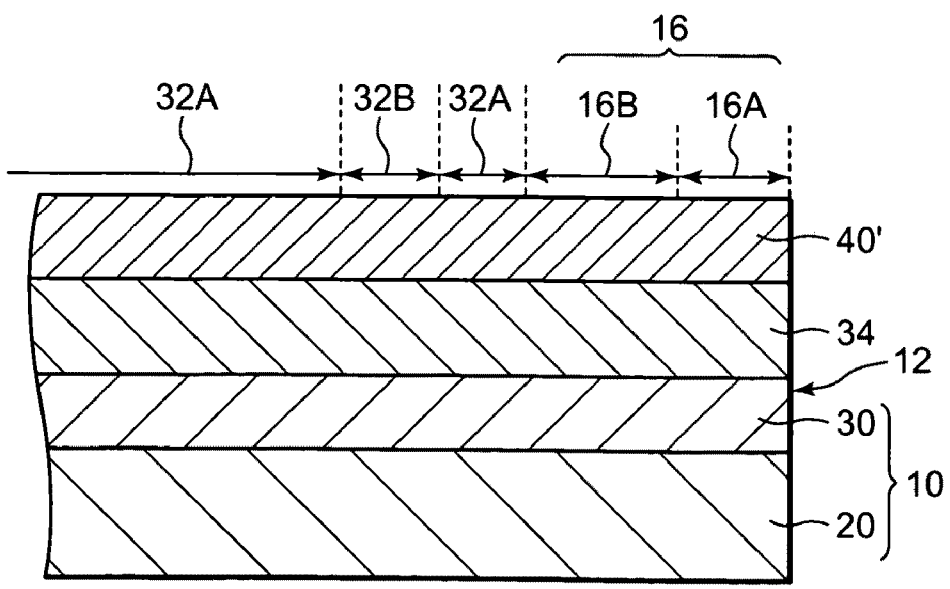

FIGS. 2A and 2B are respectively schematic views following FIG. 1B.

Figure 3A:
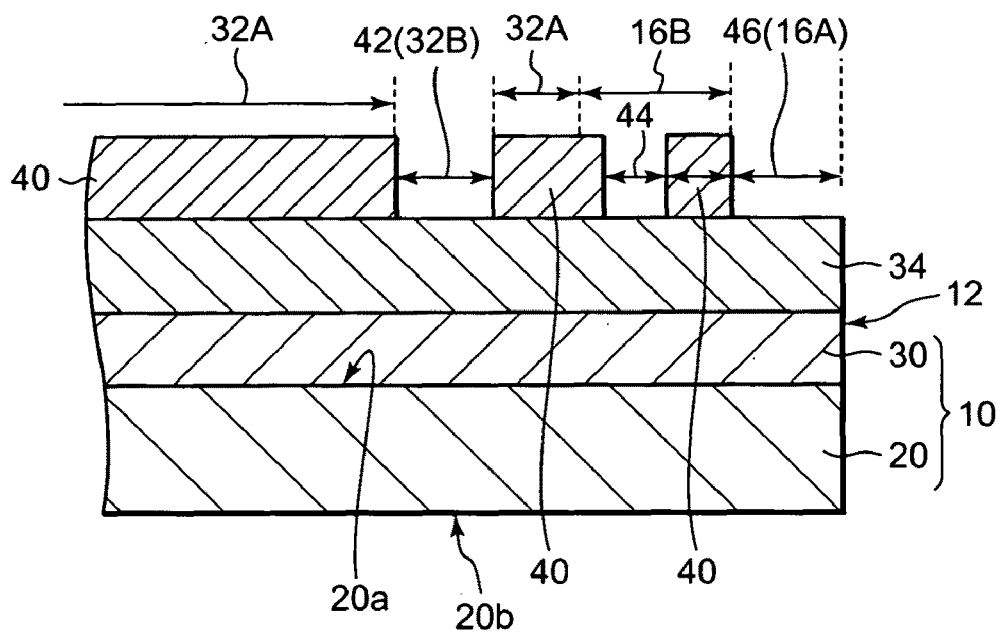
FIGS. 3A and 3B are respectively schematic views following FIG. 2B.
Figure 3B:
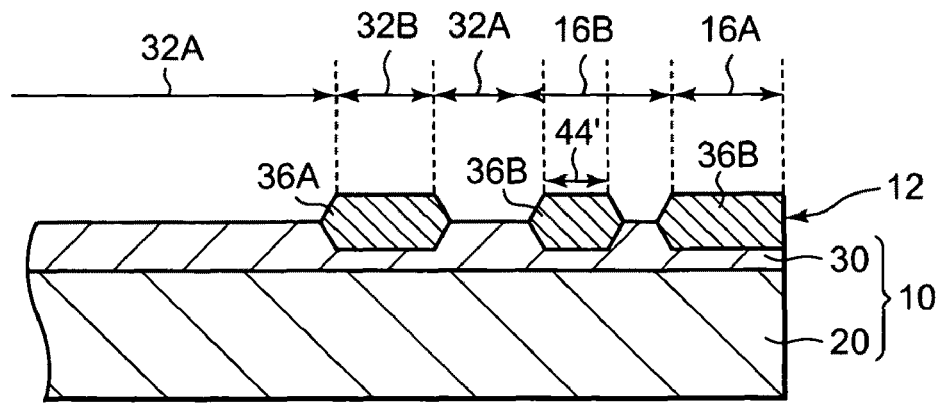

FIGS. 3A and 3B are respectively schematic views following FIG. 2B.

As shown in FIG. 1A, a substrate 10 is first prepared. The substrate 10 is of the conventional known so-called SOQ substrate having the already-described configuration. A ring-shaped or annular end face of the substrate 10 is referred to as "circumferential end face 12".

The substrate 10 includes a quartz support substrate 20. The quartz support substrate 20 has a first main surface 20a and a second main surface 20b opposite to the first main surface 20a.

A silicon layer 30 is provided on the first main surface 20a of the quartz support substrate 20.

Next, a chip forming area 14 shown as an area surrounded by a thick line in the figure is set to the substrate 10. In the present embodiment, a plurality of semiconductor devices, i.e., chips are arranged and formed in matrix form within the chip forming area 14 as indicated with being partitioned by broken lines in the drawing.

A chip non-forming area 16, which surrounds the chip forming area 14 so as to adjoin it, is set to outside the chip forming area 14. The chip non-forming area 16 is of a so-called discarded area with no chips formed therein.

Further, a circumferential area 16A is set to a particle area lying within the chip non-forming area 16 and located inwardly out of the circumferential end face 12 of the substrate 10. The circumferential area 16A is of an approximately circular ring-shaped area in the present embodiment.

The width of the ring-shaped circumferential area 16A may preferably be set to, for example, a fixed width. However, the circumferential area 16A is not limited to the fixed width, but may have widths different partly as in the case where, for example, a partial area equivalent to an orientation flat is set to a width different from one of another circular area.

The width of the circumferential area 16A may preferably be set to such a width that cracks are considered to be liable to occur in terms of prevention of the occurrence thereof.

This width may be set to, preferably, for example, 5 mm or so and a range of about 3 mm to 10 mm at lowest as viewed from the circumferential end face of the substrate.

Next, a peripheral area 16B, which surrounds the chip forming area 14 adjacent thereto inside the circumferential area 16A, is set. The peripheral area 16B is of an area which is interposed between the chip forming area 14 and the circumferential area 16A and adjacent to them. In a manner similar to the circumferential area 16A, no chips are formed even in the peripheral area 16B.

As shown in FIG. 2A, element forming areas 32A and element separation or isolation areas 32B other than the element forming areas 32A are set within the chip forming area 14.

The element forming areas 32A are of areas in which circuit elements having essential functions of chips like transistors are formed. The element isolation areas 32B are of areas formed with element isolation structure portions for electrically isolating the plural element forming areas 32A.

Next, a silicon oxide film 34 used as a substrate or foundation is formed over the entire upper surface of the silicon layer 30 in accordance with preferably, for example, a wet oxidation step or a dry oxidation step performed under arbitrary and suitable conditions known per se in the art. The substrate silicon oxide film 34 is of a constituent element provided with the aim of relaxing stress mainly.

The substrate silicon oxide film 34 may preferably be formed by performing the wet oxidation step at a temperature of, for example, 950° C. or so.

Next, as shown in FIG. 2B, a silicon nitride film 40' is formed over the entire upper surface of the substrate silicon oxide film 34 by a plasma CVD method.

The arbitrary and suitable deposition conditions known in the art can be applied as the conditions for deposition of the silicon nitride film 40' by the plasma CVD method.

Such deposition conditions will be illustrated based on the general level of technology by way of example. The deposition conditions may preferably take the following by way of example: RF power is set to a range from about 200 W (watts) to about 50 bW, the deposition temperature is set to a range from about 350° C. to about 420° C., the pressure is set to a range from about 266.6 Pa (pascals) to about 666.3 Pa (2 Torr to 5 Torr), and the gas flow rate is set to within a range from (SiH$_4$) gas/ammonia (NH$_3$) gas/nitrogen (N$_2$) gas=1:(5 to 20):(2 to 10) or so or within a range from silane gas/ammonia gas/nitrogen gas=2:(1 to 2):(20 to 70) or so.

Subsequently, as shown in FIG. 3A, the silicon nitride film 40' is patterned by the conventional known photolithography step and etching step to form a mask pattern 40.

The mask pattern 40 functions as a mask pattern for the formation of each element isolation structure portion in a LOCOS step, i.e., a thermal oxidation step.

The mask pattern 40 includes a circumferential exposure portion 46 that exposes the substrate silicon oxide film 34 in ring form within a range lying inwardly from the circumferential end face 12 of the substrate 10.

In other words, the substrate silicon oxide film 34 is exposed in the ring-shaped partial area lying inside the circumferential end face 12 of the substrate 10, i.e., the circumferential area 16A.

The mask pattern 40 has a first opening or aperture pattern 42 corresponding to a through hole which exposes the substrate silicon oxide film 34 of the element isolation area 32B, within the chip forming area 14.

The first opening pattern 42 can contain one or two or more opening form patterns. The opening form patterns are set to arbitrary and suitable ones according to the specifications of each manufactured semiconductor device.

The mask pattern 40 has a second opening or aperture pattern 44 corresponding to a through hole that exposes the substrate silicon oxide film 34, within the peripheral area 16B.

These first and second opening patterns 42 and 44 may be brought to ones each having, preferably, for example, the same opening form pattern except for the part chipped unavoidably due to the existence of the circumferential exposure portion 46. Namely, in the photolithography step for forming the mask pattern 40, an exposure step may be performed on the chip forming area 14 and the chip non-forming area 16 including the peripheral area 16B using the same exposure mask every area partitioned by the broken lines shown in FIG. 1A.

However, no limitation is imposed on it. Upon patterning of the mask pattern 40, the exposure mask used in the photolithography step of particularly the peripheral area 16B of the chip non-forming area 16 may be set as one different from the exposure mask employed in the chip forming area 14. That is, the pattern for particularly the peripheral area 16B of the chip non-forming area 16 in the mask pattern 40 needs not to be identical to the pattern for the chip forming area 14.

The pattern for the chip non-forming area 16 in the mask pattern 40 may preferably be made as small in area as possible where stress produced by the mask pattern 40 is taken into consideration.

The mask pattern 40 can also be brought to such a pattern that with the patterning of the silicon nitride film 40', the silicon nitride film 40' corresponding to the entire chip non-forming area 16 is removed, namely, the substrate silicon oxide film 34 for the chip non-forming area 16 is exposed to provide only the first opening pattern 42 in the chip forming area 14.

If done in this way, then the exposure step for forming the mask pattern 40 can be brought to an easier step.

Next, the thermal oxidation step is performed under arbitrary and suitable conditions known per se in the art using the mask pattern 40 as a mask.

With this thermal oxidation step, the area lying directly below the first opening pattern 42 of the mask pattern 40, i.e., the silicon layer 30 of the element isolation area 32B is thermally oxidized through the substrate silicon oxide film 34.

As shown in FIG. 3B, an element isolation structure portion 36A is formed in the element isolation area 32B in this way.

At this time, dummy element isolation structure portions 36B are unavoidably formed in a dummy opening pattern area 44' placed directly below the second opening pattern 44 and the circumferential area 16A placed directly below the circumferential exposure portion 46, respectively.

Next, the mask pattern 40 and the substrate silicon oxide film 34 are eliminated in accordance with a method known per se in the art.

The process of forming the element isolation structure portion 36A is completed in accordance with the above steps.

Subsequently, arbitrary and suitable steps like an element forming step and a fractionizing step may be executed until they lead to the completion, as a manufacturing process of each semiconductor device.

The relationship between changes in temperature at a silicon nitride film formed by an LP-CVD method and a silicon nitride film formed by a plasma CVD method and stress thereof will now be explained with reference to FIG. 4.

Figure 4:
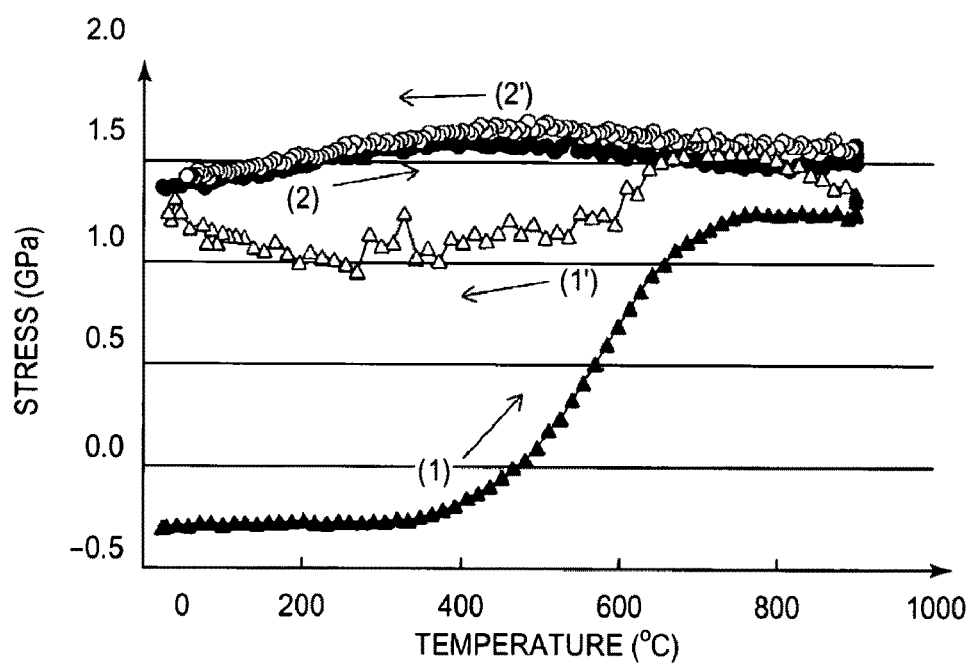
FIG. 4 is a graph showing the relationship between stress of a silicon nitride film and its temperature.
Figure 5:
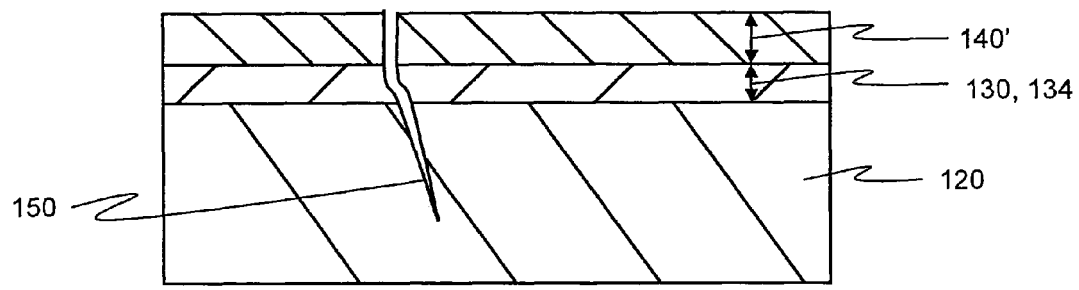
FIG. 5 is a view for describing a related art.

FIG. 4 is a graph showing the relationship between the stress of each silicon nitride films and the temperature thereof.

A sample (sample 1) provided with a silicon nitride film deposited or grown on a silicon substrate by a plasma CVD method in which deposition conditions are set as RF power: 500 W, temperature:420° C., pressure 466.6 Pa (3.5 Torr) and gas flow rate:silane gas/ammonia gas/nitrogen gas=1:6:3, and a sample (sample 2) provided with a silicon nitride film deposited on the silicon substrate by an LP-CVD method known per se in the art are first prepared.

Next, when the temperature is changed continuously at 5° C./min from a low temperature (0° C. or so) to 900° C. and from 900° C. to a low temperature by using a thin-film stress measurement machine manufactured by KLA-Tencor Corp., warpage is measured from an angle of reflection of laser light that scans over the substrate and film stress is measured by making a comparison between the measured warpage and the amount of warpage prior to the deposition.

In the drawing, the horizontal axis indicates the measured temperature (unit:° C.) and the vertical axis indicates stress of a thin film, i.e., stress (unit GPa).

A graph (1) and a graph (1') are respectively graphs related to the already-described sample 1. The graph (1) indicated by black-lacquered triangular symbols (▲) represents changes in stress from room temperature (0° C. or so) to 900° C. in the direction indicated by arrow. The graph (1') indicated by open triangular symbols (Δ) represents changes in stress taken until the temperature is returned to room temperature from 900° C., in the direction indicated by arrow.

A graph (2) and a graph (2') are respectively graphs related to the sample 2. The graph (2) indicated by black-lacquered symbols (●) represents changes in stress from room temperature to 900° C. in the direction indicated by arrow. The graph (2') indicated by open circle symbols (○) represents changes in stress taken until the temperature is returned to room temperature from 900° C., in the direction indicated by arrow.

As is understood from the graph (1), the silicon nitride film deposited by the plasma CVD method is much lower in stress at a low temperature region (range from about 0° C. to about 400° C.) than the silicon nitride film deposited by the LP-CVD method.

As is also understood from the graph (1'), the silicon nitride film deposited by the plasma CVD method has a tendency to increase in stress at a high temperature region (range from about 400° C. to about 900° C.). In a range from about 600° C. to about 200° C. in particular, the silicon nitride film produces stress of such an extent that it is slightly below the stress (refer to the graphs (2) and (2')) of the silicon nitride film deposited by the LP-CVD method. Further, there is no recovery of lower stress prior to a rise in temperature, i.e., prior to heat treatment.

Thus, in order to prevent the occurrence of cracks effectively, heat treatment, particularly heat treatment done at 400° C. or so at lowest, i.e., 400° C. or more is preferably avoided as much as possible up to the thermal oxidation step by the LOCOS method from after the deposition of the silicon nitride film by the plasma CVD method.

If done in this way, then the stress produced in the silicon nitride film 40' or the mask pattern 40 can be made extremely small up to at least the thermal oxidation step by the LOCOS method as compared with the silicon nitride film deposited by the LP-CVD method. It is therefore possible to effectively prevent the occurrence of cracks caused by the stress of the silicon nitride film 40' or the mask pattern 40.

While the preferred form of the present invention has been described, it is to be understood that modifications will be apparent to those skilled in the art without departing from the spirit of the invention. The scope of the invention is to be determined solely by the following claims.

What is claimed is:

1. A method for manufacturing a semiconductor device, the method comprising:

preparing a substrate having a quartz support substrate having a first main surface and a second main surface opposite to the first main surface, and a silicon layer provided over the first main surface;

setting to the substrate, a chip forming area including element forming areas and an element isolation area lying outside the element forming areas, and a chip non-forming area lying outside the chip forming area and including a ring-shaped circumferential area set inwardly out of a circumferential end face of the substrate and a peripheral area which surrounds the chip forming area inwardly from the circumferential area;

forming a substrate silicon oxide film over the entire upper surface of the silicon layer;

forming a silicon nitride film over the entire upper surface of the substrate silicon oxide film by a plasma CVD method;

patterning the silicon nitride film to form a mask pattern having a circumferential exposure portion that exposes the substrate silicon oxide film in the circumferential area, a first opening pattern that exposes the substrate silicon oxide film of the element isolation area in the chip forming area, and a second opening pattern that exposes the substrate silicon oxide film within the peripheral area;

thermally oxidizing the substrate using the mask pattern as a mask thereby to form an element isolation structure portion in the silicon layer of the element isolation area; and eliminating the mask pattern and the substrate silicon oxide film.

2. The method according to claim 1, wherein heat treatment done at 400° C. at lowest is avoided up to the step of forming the element isolation structure portion from after the forming step of the silicon nitride film.

3. The method according to claim 1, wherein the step of setting the chip non-forming area includes a step for setting the ring-shaped circumferential area to a range from the circumferential end face of the substrate to 3 to 10 mm.

4. The method according to claim 1, wherein the mask pattern forming step is of a step for patterning the silicon nitride film thereby to form a mask pattern that exposes the substrate silicon oxide film in the chip non-forming area and has the first opening pattern in the chip forming area.

* * * * *